(12) United States Patent
Grancharov et al.

(10) Patent No.: US 9,997,165 B2
(45) Date of Patent: Jun. 12, 2018

(54) CODING AND DECODING OF SPECTRAL PEAK POSITIONS

(71) Applicant: Telefonaktiebolaget L M Ericsson (publ), Stockholm (SE)

(72) Inventors: Volodya Grancharov, Solna (SE); Sigurdur Sverrisson, Kungsängen (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 254 days.

(21) Appl. No.: 14/402,406

(22) PCT Filed: Oct. 10, 2014

(86) PCT No.: PCT/SE2014/051199
§ 371 (c)(1),
(2) Date: Nov. 20, 2014

(87) PCT Pub. No.: WO2015/057135
PCT Pub. Date: Apr. 23, 2015

(65) Prior Publication Data
US 2016/0225378 A1    Aug. 4, 2016

Related U.S. Application Data

(60) Provisional application No. 61/892,652, filed on Oct. 18, 2013.

(51) Int. Cl.
*G10L 19/02* (2013.01)
*G10L 19/00* (2013.01)
(Continued)

(52) U.S. Cl.
CPC .......... *G10L 19/02* (2013.01); *G10L 19/0017* (2013.01); *G10L 19/20* (2013.01);
(Continued)

(58) Field of Classification Search
None
See application file for complete search history.

(56) References Cited

U.S. PATENT DOCUMENTS 6,233,213 B1    5/2001   Okada et al.
2001/0044714 A1   11/2001   Brandel et al.
(Continued)

FOREIGN PATENT DOCUMENTS

EP    2573765 A2    3/2013
RU    2493652 C2    9/2013
(Continued)

OTHER PUBLICATIONS

Bartkowiak, Maciej "Low Bit Rate Coding of Sparse Audio Spectra Using Frequency Shift and Interleaved MDCT" *15th European Signal Processing Conference, Poznan, Poland* (pp. 1367-1371) (Sep. 3-7, 2007).
(Continued)

*Primary Examiner* — Richa Mishra
(74) *Attorney, Agent, or Firm* — Sage Patent Group

(57) ABSTRACT

A coder and decoder, and methods therein, are provided for coding and decoding of spectral peak positions in audio coding. According to a first aspect, an audio signal segment coding method is provided for coding of spectral peak positions. The method comprises determining which one out of two lossless spectral peak position coding schemes that requires the least number of bits to code the spectral peak positions of an audio signal segment; and selecting the spectral peak position coding scheme that requires the least number of bits to code the spectral peak positions of the audio signal segment. A first one of the two lossless spectral peak position coding schemes is suitable for periodic or semi-periodic spectral peak position distributions; and a second one of two lossless spectral peak position coding
(Continued)

schemes is suitable for sparse spectral peak position distributions.

19 Claims, 10 Drawing Sheets

(51) Int. Cl.
  *G10L 19/20* (2013.01)
  *G10L 19/22* (2013.01)
  *H03M 7/40* (2006.01)

(52) U.S. Cl.
  CPC .............. *G10L 19/22* (2013.01); *H03M 7/40* (2013.01); *H03M 7/4031* (2013.01)

(56) References Cited

U.S. PATENT DOCUMENTS

| | | |
|---|---|---|
| 2007/0016404 A1 | 1/2007 | Kim et al. |
| 2008/0312758 A1* | 12/2008 | Koishida .............. G10L 19/02 700/94 |
| 2012/0029925 A1* | 2/2012 | Duni .................... G10L 19/038 704/500 |
| 2012/0065980 A1 | 3/2012 | Krishnan et al. |
| 2013/0110522 A1* | 5/2013 | Choo ..................... G10L 21/00 704/500 |
| 2013/0117015 A1* | 5/2013 | Bayer ................... G10L 19/022 704/207 |

FOREIGN PATENT DOCUMENTS

| | | |
|---|---|---|
| WO | WO 2010/147436 A2 | 12/2010 |
| WO | WO 2015/171061 A1 | 11/2015 |

OTHER PUBLICATIONS

International Search Report, International Application No. PCT/SE2014/051199 dated Mar. 18, 2015, 7 pages.
Written Opinion of the International Searching Authority, International Application No. PCT/SE2014/051199 dated Mar. 18, 2015, 12 pages.
S. Quackenbush: "A 7 kHz Bandwidth, 32 kbps Speech Coder for ISDN", Institute of Electrical and Electronics Engineers; Speech Processing 1. Toronto, May 14-17, 1991; vol. Conf. 16, XP010043809, 4 pages.
Salomon et al: "Sparse Strings—OR-ing Bits", Handbook of Data Compression, Jan. 1, 2010, XP055174836, pp. 1110-1111.
Salomon et al: "Handbook of Data Compression" Fifth Edition, 2010, p. 1111.
Invitation of Pay Additional Fees and, Where Applicable, Protest Fee, Application No. PCT/SE2014/051199, dated Jan. 20, 2015.
International Preliminary Report on Patentability, Application No. PCT/SE2014/051199, dated Dec. 4, 2015.
Decision to Grant and English Translation of Granted Claims for Japanese Patent Application No. 2016-517551 dated Jul. 3, 2017.
Decision to Grant for Russian Patent Application No. 2016119007 dated Aug. 31, 2017 (2 pages).

* cited by examiner

Spectral postions

CODING AND DECODING OF SPECTRAL PEAK POSITIONS

CROSS REFERENCE TO RELATED APPLICATION

This application is a 35 U.S.C. § 371 national stage application of PCT International Application No. PCT/SE2014/051199, filed in the English language on 10 Oct. 2014, which itself claims the benefit of U.S. Provisional Patent Application No. 61/892,652, filed 18 Oct. 2013, the disclosures and contents of both of which are incorporated by reference herein in their entirety.

TECHNICAL FIELD

The proposed technology generally relates to audio signal segment coding/decoding and in particular to coding/decoding of spectral peak positions.

BACKGROUND

Many audio coding techniques exploit characteristics of human hearing. For example, a weak tone near a strong tone may not need to be coded, since the human auditory system is less sensitive for such weak tones. In traditional, so-called perceptual audio coding, quantization of different frequency data is based on models of human hearing. For example, perceptually important frequency data are allocated more bits and thus finer quantization and vice versa.

One type of audio coding is so-called transform coding. In transform coding, a block of input audio samples is transformed, e.g., via the Modified Discrete Cosine Transform, processed, and quantized. The quantization of the transformed coefficients is performed based on the perceptual importance. One audio parameter that needs to be encoded is the positions of spectral peaks. An example of spectral peak positions for an audio segment, in the transform domain, is shown in FIG. 1a.

The spectral peak positions are typically encoded by use of a lossless coding scheme, such as Huffman coding. However, prior art solutions consume many bits on encoding of spectral peaks.

SUMMARY

It would be desirable to encode spectral peak positions in a more efficient way than in prior art solutions.

According to a first aspect, an audio signal segment coding method is provided for coding of spectral peak positions. The method comprises determining which one out of two lossless spectral peak position coding schemes that requires the least number of bits to code the spectral peak positions of an audio signal segment; and selecting the spectral peak position coding scheme that requires the least number of bits to code the spectral peak positions of the audio signal segment. A first one of the two lossless spectral peak position coding schemes is suitable for periodic or semi-periodic spectral peak position distributions; and a second one of two lossless spectral peak position coding schemes is suitable for sparse spectral peak position distributions. This is also valid for all aspects described below.

According to a second aspect, an audio signal segment coder is provided, for coding of spectral peak positions. The coder is configured to determine which one out of two lossless spectral peak position coding schemes that requires the least number of bits to code the spectral peak positions of an audio signal segment; and further to select the spectral peak position coding scheme that requires the least number of bits to code the spectral peak positions of the audio signal segment According to a third aspect, a user terminal is provided, which comprises an audio signal segment coder according to the second aspect.

According to a fourth aspect, an audio signal segment decoding method is provided for decoding of spectral peak positions. The method comprises receiving coded spectral peak positions of an audio signal segment; and also receiving an indicator of a lossless coding scheme, out of two lossless coding schemes, that was selected to code the spectral peak positions. The method further comprises decoding the spectral peak positions in correspondence with the indicated coding scheme;

According to a fifth aspect, an audio signal segment decoder is provided for decoding of spectral peak positions. The decoder is configured to receive coded spectral peak positions of an audio signal segment; and further to receive an indicator of a lossless coding scheme, out of two lossless coding schemes, that was selected to code the spectral peak positions. The decoder is further configured to decode the spectral peak positions in correspondence with the indicated coding scheme.

According to a sixth aspect, a mobile terminal is provided, which comprises an audio signal segment decoder according to the fifth aspect.

BRIEF DESCRIPTION OF DRAWINGS

The embodiments, together with further objects and advantages thereof, may best be understood by making reference to the following description taken together with the accompanying drawings, in which.

DETAILED DESCRIPTION

Throughout the drawings, the same reference designations may be used for similar or corresponding elements.

The proposed technology deals with lossless coding of spectral peak positions, as extracted from a short segment, for example 10-40 ms, of an audio signal. The proposed technology also deals with decoding of spectral peak positions that have been coded in accordance with this technology.

It is realized by the inventors that conventional methods for encoding spectral peak positions fail to address the fact that peak positions in audio signals may have very abrupt changes in distribution, which makes it inefficient to code the peak positions with a single coding scheme. In certain cases the spectrum can be semi-periodic, which makes a differential, or delta coding scheme very efficient. In other cases the spectral peaks can be clustered, leaving large sparse regions.

A main concept of the proposed technology is to use dedicated coding schemes for different peak position distributions, and switch between the coding schemes in a closed loop manner. Each of the different coding schemes should be suitable for a specific peak position distribution. By suitable is meant e.g. that the coding scheme is especially efficient for a certain type of spectral peak distribution. When it herein is stated that a coding scheme A is suitable for a peak distribution C and a coding scheme B is suitable for a peak distribution D, it may be assumed that A generally is more efficient than B for peak distribution C, while B generally is more efficient than A for peak distribution D.

Assume we have a set of N spectral peak positions $\{P_1, P_2, P_3, \ldots, P_N\}$, which has to be compressed and transmitted in a lossless way. The number of peaks as well as their distribution varies with time. Examples of two different sets of spectral peak positions are illustrated in FIGS. 1a and 1b.

Figure 1A:
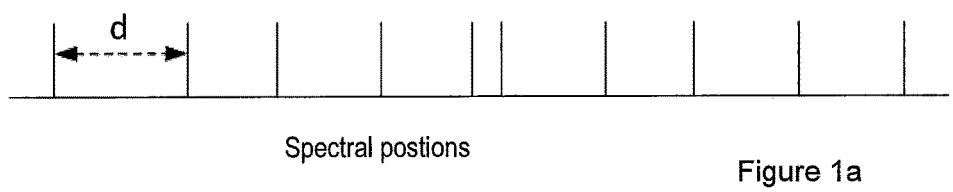
FIGS. 1a and 1b are examples of spectral peak position distributions.

FIG. 1a illustrates a spectral peak distribution that is close to periodic. This case is efficiently handled by, for example, delta coding described below.

Figure 1B:

FIG. 1b illustrates a spectral peak distribution that is sparse and has a large distance between two neighboring peaks. This case is difficult to handle with delta coding due to the large delta between the peaks.

It has been found by the inventors that large variations in the number of peaks and their distribution may, with advantage, be handled by coding with alternative compression or coding schemes. Herein, it is focuses on two exemplifying coding schemes, which may be denoted delta coding and sparse coding, and which are described below. The delta coding could alternatively be denoted periodic coding. However, it is also feasible to use more than two coding schemes suitable for different spectral peak position distributions.

Delta Coding

This coding scheme is suitable for peak distributions like the one illustrated in FIG. 1a, which may be characterized as periodic or semi-periodic or close to periodic. The concept of delta coding is to form differences, which herein are denoted d or $\Delta$, between consecutive spectral peak positions $P_j$ or $\{P_1, P_2, P_3, \ldots, P_N\}$ in and audio signal segment as:

$$d_1 = P_1 - P_0 \quad (1)$$
$$d_2 = P_2 - P_1$$
$$\ldots$$
$$d_N = P_N - P_{N-1}$$

The differences, also denoted deltas, are then encoded using a suitable coding method. A preferred coding method for the differences is Huffman coding. Assume that we have M deltas of different size. These are mapped to variable length codewords, e.g.

$$\{d(1), d(2), d(3), \ldots, d(M)\} \rightarrow \{0, 10, 11, \ldots, 111110\} \quad (2)$$

Here, d(1) is the difference or step size $d_j$ that appears most often and is therefore mapped to the shortest codeword "0", while d(M) is very rare and is therefore mapped to the longest codeword "111110". In this example the longest codeword requires 6 bits, but both longer and shorter longest codewords are also feasible. By mapping the most frequent delta to the shortest codeword and rare deltas to the longest codewords, the number of bits used for encoding the deltas will be minimized. This coding method is efficient as long as there are not too many different step sizes that appear too frequently. Stated differently: the more different step sizes, the longer codewords, and when step sizes mapped to long codewords appear often, the efficiency of the coding method decreases.

The Huffman codewords are transmitted to the decoder, and corresponding deltas are then extracted by the decoder. By knowing $d_j$ and $P_{j-1}$, the decoder can reconstruct $P_j$ by iteration.

In addition to the deltas, the decoder needs to know the initial position $P_0$. Due to imposed constraints on the minimum distance between peaks, $P_0$ is considered as a special case. For example, there may be a restriction that two neighboring peaks have to be separated by at least 2 empty positions. Since there are no deltas shorter than 3 in this case, no Huffman codewords are needed for such deltas during the rest of the segment or frame. However, the very first peak in an audio signal segment $P_0$ can appear in the beginning of the scale (spectrum) with an offset from zero that is smaller than 3. To avoid this problem without having to add a number of Huffman codewords for these possible initial deltas smaller than 3, an offset determined from −3 is used instead of an offset determined from 0. Thus, when $P_0$ is located e.g. in position 1, the codeword for $\Delta=4$ is used. The result of such a simple operation is that it is possible to limit the number of used Huffman codewords. This will minimize the length of the used Huffman codewords, since in general, less Huffman codewords gives shorter Huffman codewords.

Sparse Coding

This coding scheme is suitable for peak distributions like the one illustrated in FIG. 1b, which may be characterized as sparse. Sparse is considered to imply that there may be large distances between consecutive peaks and that the peaks are not necessarily periodic. Assuming an example below of a spectral peak position vector, where ones "1" indicate presence of a peak and zero's "0" indicate absence of a peak:

$$\{01000000000000000100\} \quad (3)$$

In delta coding this would imply ($P_1$=2 and $P_2$=18),). The exemplifying peak position vector above should illustrate spectral peaks being very far apart in relation to other peak differences, even though the distance 16 may not be considered very far apart in a more authentic example vector.

The first step of this sparse coding scheme is to form equal size groups of, for example, 5 bits, as:

$$\{01000, 00000, 00000, 00100\} \quad (4)$$

Then each group is checked for non-zero elements, for example by OR-ing the elements within each group. The result is stored in a second bit vector, which is 5 time shorter. This bit vector is illustrated in bold below in order to be more easily distinguished:

$$\{01000, 00000, 00000, 00100\} \rightarrow \{\mathbf{1001}\} \quad (5)$$

In this exemplifying embodiment, the bitstream that should be transmitted to the decoder would look like:

$$\{\mathbf{1001}, 01000, 00100\} \quad (6)$$

The decoder reads the signaling layer "1001" from the bitstream. These 4 bits indicate that what will follow in the bitstream is a description of the 1st and 4th group, while the 2nd and 3rd group have to be filled-in with zero's.

Because of the above mentioned constraints in the minimum allowed distance between two consecutive peaks, the scheme above may be modified to achieve further, still lossless, compression gain. Since there are only 8 possible levels for each 5-dim vector, due to the constraint that peaks should be separated by at least two positions, these vectors can be indexed with only 3 bits, see Table 1 below. In this embodiment the bitstream looks as:

$$\{1001,001,010\} \quad (7)$$

and instead of 5 bits, as in the example further above, only 3 bits are required for identifying each non-zero bit group.

TABLE 1

Table 1: Indexing of 5-dim vectors. The 3-bit index is extracted from the bitstream and the corresponding 5-dim vector, denoted group above and in the table, is reconstructed.

| group | index |
| --- | --- |
| 10000 | 000 |
| 01000 | 001 |
| 00100 | 010 |
| 00010 | 011 |
| 00001 | 100 |
| 10010 | 101 |
| 10001 | 110 |
| 01001 | 111 |

An alternative lossless sparse spectral peak position coding scheme can be based on logical operation of OR-ing bits as described in [1].

The coding schemes described above each have problems for certain peak position distributions:

A problem with the sparse coding scheme is that it can actually increase the amount of data if the input is not sparse enough.

A problem with the delta coding scheme is that it is very inefficient for outliers, e.g., very large delta steps, when the majority of the distances are small.

However, the two coding schemes described above can be seen as complementing each other, and it has been realized by the inventors that a very efficient coding system can be formed by combining their strengths. An example of a closed loop decision logic is outlined below:

IF $L_d > L_s$

Use sparse coding

ELSE

Use delta coding (8)

where $L_d$ is the total number of bits consumed by the delta coding scheme, $L_s$ is the total number of bits consumed by the sparse coding scheme.

The decision logic (8) requires that both coding schemes can actually be performed. In some cases, when the largest distance $d_{max}$ between two consecutive peaks is greater than the largest distance T that is possible to delta code, based on the pre-stored Huffman table, the total number of bits $L_d$ consumed by the delta coding scheme cannot be explicitly calculated. In order to cover such cases the decision logic (8) may be slightly modified into:

IF $\{(d_{max} > T) \text{OR} (L_d > L_s)\}$

Use sparse coding

ELSE

Use delta coding (9)

The first part of the OR-clause in decision logic (9) may be considered as a shortcut, since the delta coding does not have to be explicitly performed if distance $d_{max} > T$. Expressed differently: when the criterion $d_{max} > T$ is fulfilled for an audio signal segment or frame, the delta coding should not be performed, and it may be decided to use the sparse coding without comparing the result from both coding methods. That is, in this case $L_d$ may be considered to be larger than $L_s$ by default, and only the sparse coding needs to be performed.

Figure 2:
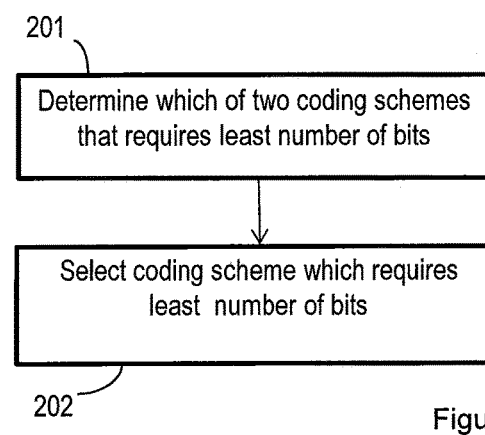
FIGS. 2-4 are flow charts illustrating exemplifying embodiments of the coding method of the proposed technology.
Figure 3:
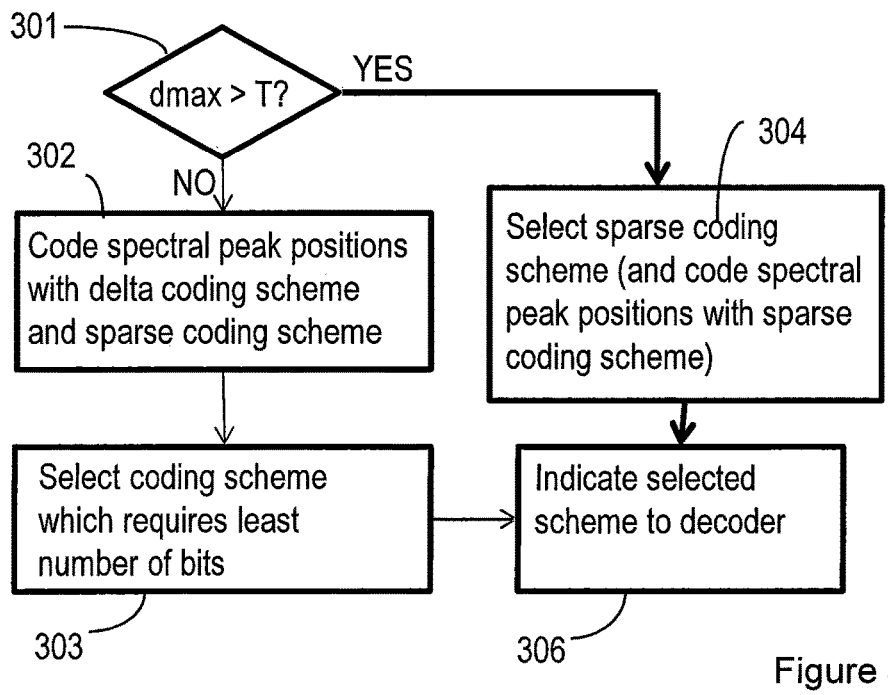

FIGS. 2 and 3 are flow charts illustrating the method of the proposed technology according to at least one embodiment. The method is intended to be performed by an audio coder, which may also be denoted audio encoder, operable to encode audio signal segments. In this embodiment, the decision logic (9) is implemented, and the exemplifying number of lossless coding schemes is two. The method comprises determining 201 which one out of two lossless spectral peak position coding schemes that requires the least number of bits to code the spectral peak positions of an audio signal segment; and selecting 202 the spectral peak position coding scheme that requires the least number of bits to code the spectral peak positions of the audio signal segment. This embodiment could also be described, in more detail, with reference to FIG. 3. In an action 301, it is determined whether or not $d_{max}$, alternatively denoted $\Delta_{max}$, is larger than T; ($d_{max} > T$). The condition could, obviously, alternatively be formulated e.g. as $d_{max} \geq T$. When $d_{max}$ is larger than T, the sparse coding is selected 304, and the spectral peak positions may be coded using the sparse coding scheme. This enables making a decision regarding which coding scheme to use before encoding the spectral peak positions when $d_{max} > T$. The delta coding can be configured for efficiently coding deltas which are smaller than T, while not necessarily handling deltas larger than T. In other words, the size of the Huffman table may be optimized together with the sparse peak position coding scheme, such that the efficiency of the sparse coding scheme for deltas above certain size is exploited by that such deltas are not represented in the Huffman table. This optimization results in an overall short codeword size in the Huffman table, which is very beneficial for the coding efficiency. The sparse coding scheme is the coding scheme requiring the least number of bits for $d_{max} > T$.

When $d_{max}$ is not larger than T, i.e. when the condition 301 is not fulfilled; the spectral peak positions are encoded 302 using both coding schemes. That is, the spectral peak positions are encoded using delta coding and sparse coding, respectively, rendering two different results. Each of the coding schemes requires a certain number of bits, cf. $L_d$ and $L_s$ above, to encode the current set of spectral peak positions. This number of bits may be observed and the numbers may be compared to determine which coding scheme that was most efficient for the current peak distribution. Based on the respective number of bits required for the different methods, it may be determined which of the coding schemes that required the least number of bits to encode the current set of spectral peak positions, and the coding scheme which required the least number of bits may be selected 303. The determining, i.e. the comparing of required number of bits in this case, could be regarded as incorporated in the action 303 or in the action 302. The selected coding scheme, either selected in action 304 or in action 303, may then be indicated 306 to the decoder in association with the encoded spectral peaks positions. That is, in association with the transmission of the version of the coded spectral peak positions that was encoded by use of the selected coding scheme. The version encoded with the other, not selected, coding scheme is not to be used and may be discarded.

The delta coding, which could also be denoted a first one of the two lossless spectral peak position coding schemes, is suitable for encoding of periodic or semi-periodic spectral peak position distributions; and the sparse coding, which could also be denoted a second one of the two lossless spectral peak position coding schemes, is suitable for sparse spectral peak position distributions. The delta coding preferably comprises delta coding of peak positions and Huffman coding of the delta codes, as described above. This could alternatively be referred to as delta-Huffman coding.

The sparse spectral peak position coding scheme may, as described above, comprise dividing a bit vector representing the spectral peak positions into consecutive equal size bit groups (see expression (4)); OR-ing the bits in each bit group to form a group bit vector (see expression (5)); compressing non-zero bit groups by exploiting constraints in the minimum allowed distance between two consecutive peaks (see expression (6) and table 1); and further forming a compressed bit vector by concatenating the group bit vector and the compressed non-zero bit groups (see expression (7)). The term "OR-ing" is here also considered to embrace variants where the bits in a group are checked for ones "1 s" in some other way, rendering the same result as OR-ing. For example, the bits of the group could be checked one by one, and if a "1" is detected, the group is determined to be a non-zero bit group.

Figure 4:
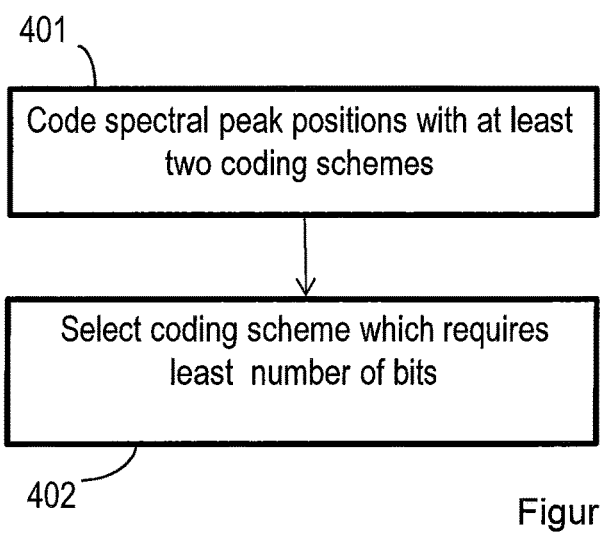

FIG. 4 is a flow chart illustrating the method of the proposed technology according to an embodiment implementing at least the decision logic (8) described above. Step 401 codes spectral peak positions of an audio signal segment in accordance with at least two lossless spectral peak position coding schemes suitable for different spectral peak position distributions. Step 402 selects the spectral peak position coding scheme that requires the least number of bits to code the spectral peak positions of the audio signal segment. The actions 401 and 402 could be identical to actions 302 and 303 in FIG. 3.

The steps, functions, procedures, modules, units and/or blocks described herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules, units and/or blocks described above may be implemented in software such as a computer program for execution by suitable processing circuitry including one or more processing units.

The flow diagram or diagrams presented herein may be regarded as a computer flow diagram or diagrams, when performed by one or more processors. A corresponding apparatus may be defined as a group of function modules, where each step performed by the processor corresponds to a function module. In this case, the function modules are implemented as a computer program running on the processor.

Examples of processing circuitry includes, but is not limited to, one or more microprocessors, one or more Digital Signal Processors, DSPs, one or more Central Processing Units, CPUs, video acceleration hardware, and/or any suitable programmable logic circuitry such as one or more Field Programmable Gate Arrays, FPGAs, or one or more Programmable Logic Controllers, PLCs.

It should also be understood that it may be possible to re-use the general processing capabilities of any conventional device or unit in which the proposed technology is implemented. It may also be possible to re-use existing software, e.g. by reprogramming of the existing software or by adding new software components.

Embodiments described herein also relate to an encoder operable to encode audio signals. The coder is configured to perform at least one embodiment of the method performed by a coder described above. The coder is associated with the same technical features, objects and advantages as the method described above and illustrated e.g. in FIG. 3. The coder will be described in brief in order to avoid unnecessary repetition Below, an exemplifying coder 500, configured to enable the performance of an above described method for coding of spectral peak positions will be described with reference to FIG. 5. The coder may be comprised in a user terminal or be comprised in a network node, such as a gateway. The coder 500 may be assumed to be configured with functionality to perform the two lossless spectral peak position coding schemes, described above.

Figure 5:
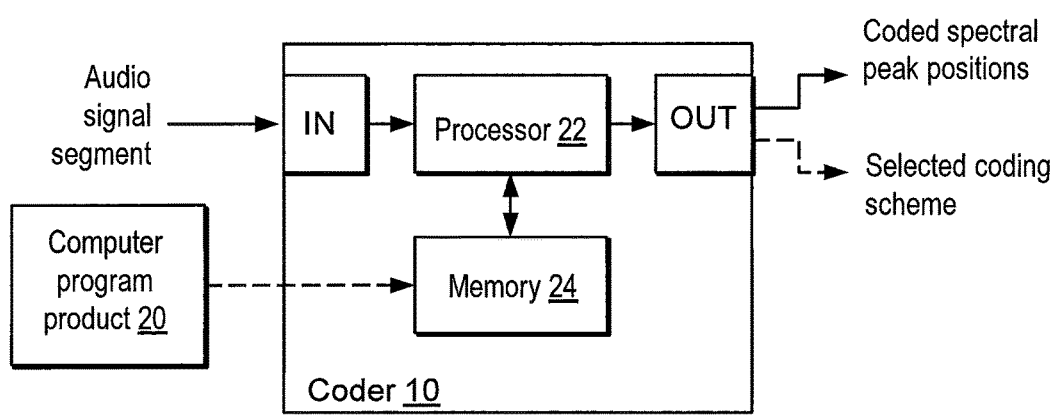
FIGS. 5-9 are block diagrams illustrating exemplifying embodiments of the proposed coder.

FIG. 5 is a block diagram illustrating an embodiment of a proposed coder 10. This embodiment includes processing means in form of a processor 22 and a memory 24.

The memory comprises instructions, e.g. in form of a computer program which when executed by the processing means causes the coder 10 to determine which one out of two lossless spectral peak position coding schemes that requires the least number of bits to code the spectral peak positions of an audio signal segment. Preferably, the coder 10 is configured to apply decision logic (9) as described above. This may be performed as determining whether a parameter $d_{max}$ exceeds a threshold, and if not, comparing, after coding the spectral peak positions with both coding schemes, a number of bits required by the two coding schemes for encoding the spectral peak positions. The execution of the instructions further causes the coder 10 to select the spectral peak position coding scheme that requires the least number of bits to code the spectral peak positions of the audio signal segment. The coder 10 is configured with the two coding schemes, which may also be part of the instructions stored in the memory 24, or alternatively be stored or implemented in some other part of the coder (not shown). As before, a first one of the two lossless spectral peak position coding schemes is suitable for periodic or semi-periodic spectral peak position distributions; and a second one of the two lossless spectral peak position coding schemes is suitable for sparse spectral peak position distributions. This could also be described as that the coder 10 is operative to encode spectral peaks in two different coding modes;

The instructions may be stored as a computer program product 20 on a computer readable medium (tangible non-transitory medium) and may be transferred to the memory 24, as indicated by the dashed arrow on the left side of the figure. The audio signal segment is forwarded to the processor 22 over an input unit IN, and the coded spectral peak positions are forwarded to a decoder over an output unit OUT. The selected coding scheme may be explicitly signaled to decoder, as indicated by the dashed arrow in FIG. 5, or as an alternative, it may be detected at the decoder by trial decoding of the received bit stream in the possible decoding modes and selecting the one that was successful.

The first alternative is less complex, but requires more bandwidth. The second alternative requires less bandwidth, but is more complex. Similar alternatives apply to the other embodiments described below.

Figure 6:
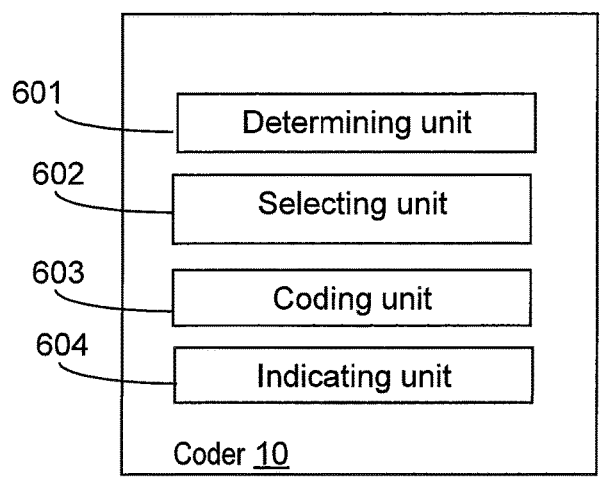

An alternative embodiment of the coder 10 is shown in FIG. 6. FIG. 6 illustrates a coder 10, operable to encode audio signals. The coder 10 comprises a determining unit 603 configured to determine which one out of two lossless spectral peak position coding schemes that requires the least number of bits to code the spectral peak positions of an audio signal segment. The coder 10 further comprises a selecting unit 604, configured to select the spectral peak position coding scheme that requires the least number of bits to code the spectral peak positions of the audio signal segment.

Figure 7:
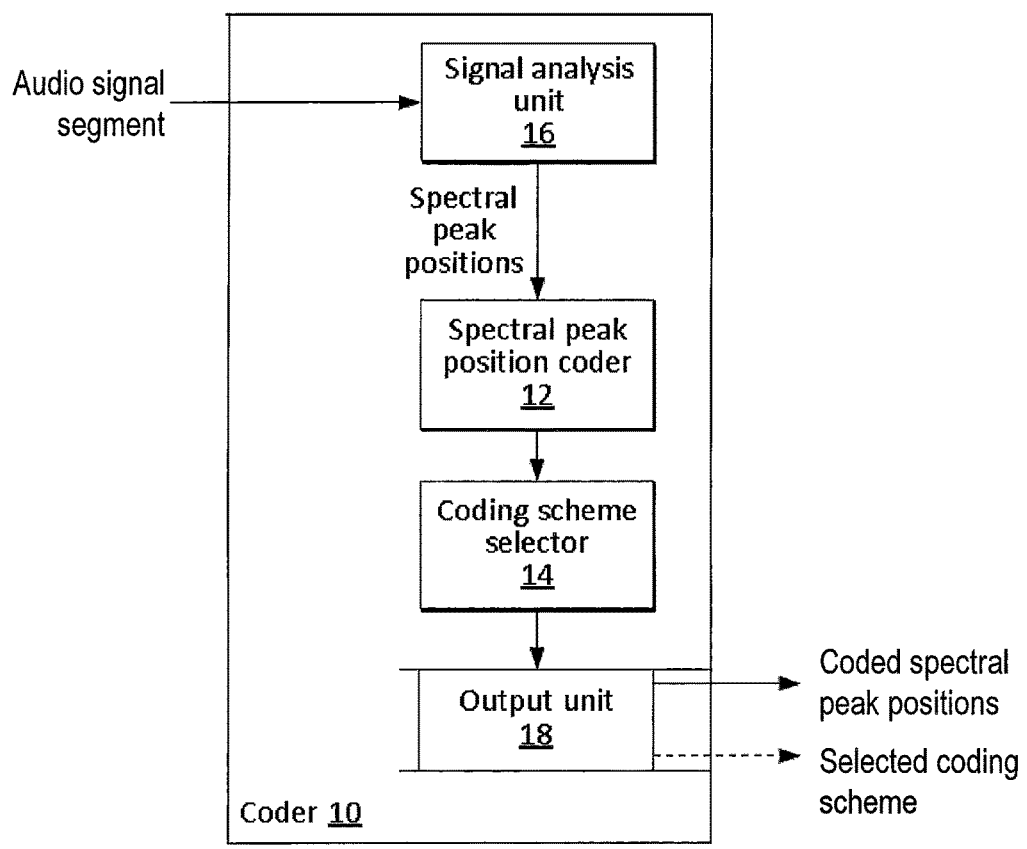

FIG. 7 is a block diagram illustrating an exemplifying embodiment of a proposed coder 10. The coder 10 is configured to perform a method for coding of spectral peak positions implementing at least decision logic (8) as described above. An audio signal segment is forwarded to a signal analysis unit 16, which analyzes the segment for coding purposes. One of the extracted features from this analysis is a set of spectral peak positions. This analysis may be performed by use of a suitable prior art method. These spectral peak positions are forwarded to a spectral peak position coder 12 configured to code the spectral peak positions of the audio signal segment in accordance with at least two lossless spectral peak position coding schemes suitable for different spectral peak position distributions. The total number of bits of each coding scheme, i.e. the number of bits required by the respective method for encoding the spectral peak positions, are forwarded to a coding scheme selector 14 configured to select the spectral peak position coding scheme that requires the least number of bits to code the spectral peak positions of the audio signal segment. The selected coded spectral peak positions are forwarded to an output unit 18 and forwarded to a decoder.

Figure 8:
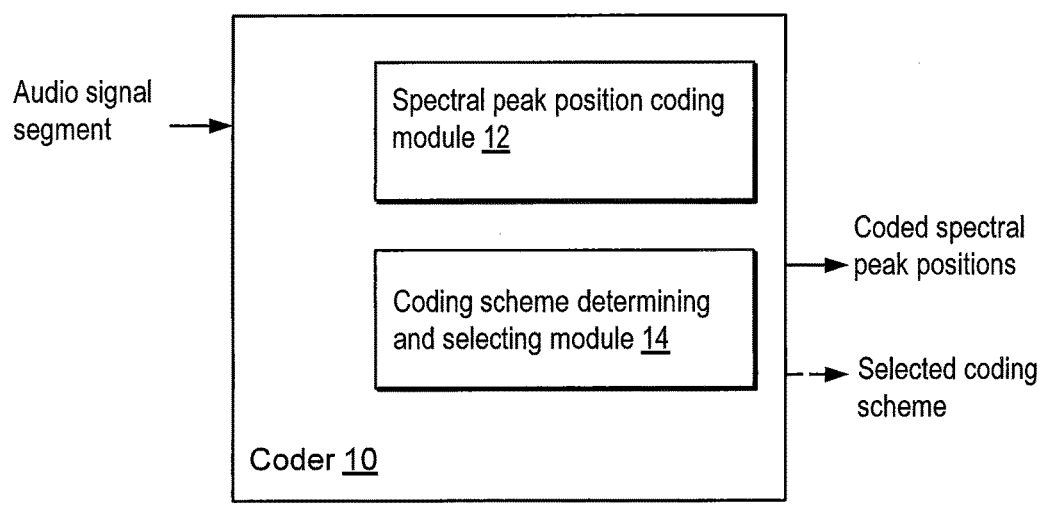

FIG. 8 is a block diagram illustrating another embodiment of the proposed coder 10. A set of spectral peak positions is forwarded to the coder 10, which includes a spectral peak position coding module 12 for coding spectral the peak positions of the audio signal segment in accordance with at least two lossless spectral peak position coding schemes suitable for different spectral peak position distributions. The coder 10 also includes a coding scheme selecting module 14 for selecting the spectral peak position coding scheme that requires the least number of bits to code the spectral peak positions of the audio signal segment. The selected coded spectral peak positions are forwarded to a decoder. The selected coding scheme may also be indicated to the decoder, as noted above.

When the coder 10 is configured to support decision logic (9) described above, the coding scheme selecting module 14 should be further configured to determine which one out of the at least two lossless spectral peak position coding schemes that requires the least number of bits to code the spectral peak positions also depending on a criterion related to the maximum distance between two consecutive peak positions. That is, the coding scheme selecting module 14 should be configured to determine, before encoding of the spectral peak positions, whether the maximum distance $d_{max}$ exceeds a predetermined threshold or not, and take action in accordance with the result, cf. FIG. 3.

Figure 9:
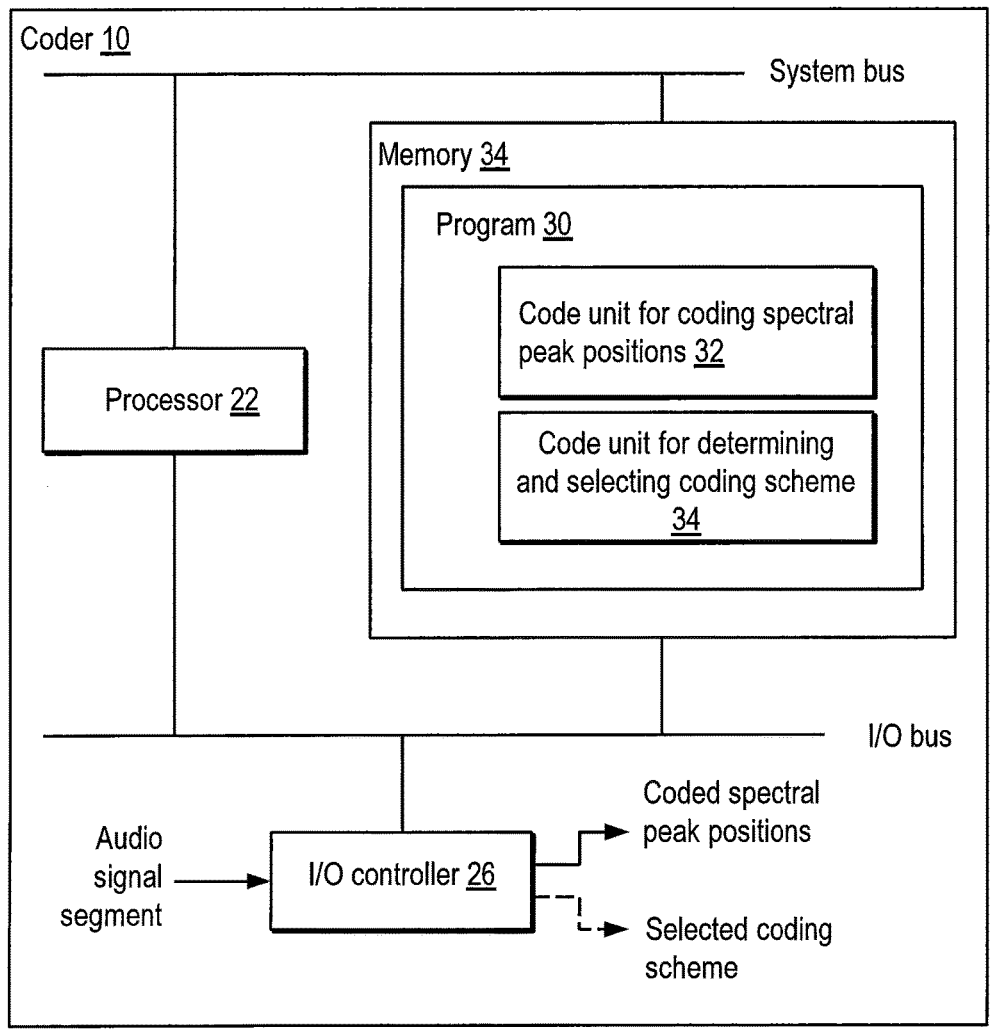

FIG. 9 is a block diagram illustrating another embodiment of the proposed coder 10. This embodiment is based on a processor 22, for example a microprocessor, which executes a computer program 30 for coding spectral peak positions of an audio signal segment. The computer program is stored in memory 24. The processor 22 communicates with the memory over a system bus. The incoming audio signal segments are received by an input/output (I/O) controller 26 controlling an I/O bus, to which the processor 22 and the memory 24 are connected. The coded spectral peak positions obtained from the software 30 are outputted from the memory 24 by the I/O controller 26 over the I/O bus. The computer program 30 includes a code unit 32 for coding spectral peak positions of an audio signal segment in accordance with two lossless spectral peak position coding schemes suitable for different spectral peak position distributions, and a code unit 34 for determining and selecting the spectral peak position coding scheme that requires the least number of bits to code the spectral peak positions of the audio signal segment.

The computer program residing in memory may be organized as appropriate function modules configured to perform, when executed by the processor, at least part of the steps and/or tasks described above. An example of such function modules is illustrated in FIG. 8. The software or computer program may be realized as a computer program product, which is normally carried or stored on a computer-readable medium (tangible non-transitory medium). The computer-readable medium may include one or more removable or non-removable memory devices including, but not limited to a Read-Only Memory, ROM, a Random Access Memory, RAM, a Compact Disc, CD, a Digital Versatile Disc, DVD, a Universal Serial Bus, USB, memory, a Hard Disk Drive, HDD storage device, a flash memory, or any other conventional memory device. The computer program may thus be loaded into the operating memory of a computer or equivalent processing device for execution by the processing circuitry thereof.

For example, the computer program includes instructions executable by the processing circuitry, whereby the processing circuitry is able or operative to execute the steps, functions, procedure and/or blocks described herein. The computer or processing circuitry does not have to be dedicated to only execute the steps, functions, procedure and/or blocks described herein, but may also execute other tasks.

The proposed technology also includes a user terminal including an audio signal segment coder as described above. The user terminal may be a wired or wireless device.

As used herein, the term "wireless device" may refer to a User Equipment, UE, a mobile phone, a cellular phone, a Personal Digital Assistant, PDA, equipped with radio communication capabilities, a smart phone, a laptop or Personal Computer, PC, equipped with an internal or external mobile broadband modem, a tablet PC with radio communication capabilities, a portable electronic radio communication device, a sensor device equipped with radio communication capabilities or the like. In particular, the term "UE" should be interpreted as a non-limiting term comprising any device equipped with radio circuitry for wireless communication according to any relevant communication standard.

As used herein, the term "wired device" may refer to at least some of the above devices, with or without radio communication capability, for example a PC, when configured for wired connection to a network.

Figure 10:
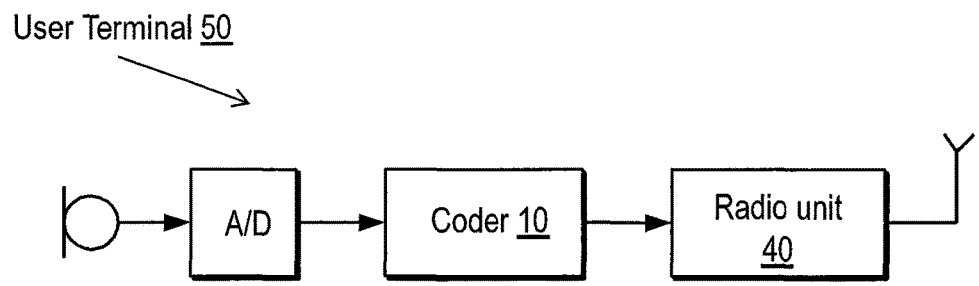
FIG. 10 is a block diagram illustrating an embodiment of a proposed user terminal.

FIG. 10 is a block diagram illustrating an embodiment of a proposed user terminal 50. The example illustrates a UE. An audio signal from a microphone is forwarded to an analog/digital converter A/D, and the digital signal is processed by a coder 10 in accordance with the proposed technology. In particular the coder 10 codes the spectral peak positions of audio signal segments as described above (typically the coder may perform other task, such as frequency transformation of the audio signal segments and coding of other parameters describing the segment, but these tasks are not described since they are well known in the art and do not form an essential part of the proposed technology). The coded spectral peak positions (and other parameters) are forwarded to a radio unit 40 for transmission to a decoder. Optionally the selected coding scheme may also be forwarded to the decoder, as noted above.

Embodiments described herein also relate to an audio signal segment decoding method for decoding of spectral peak positions. The method is a corresponding method to the previously described coding method.

Figure 11:
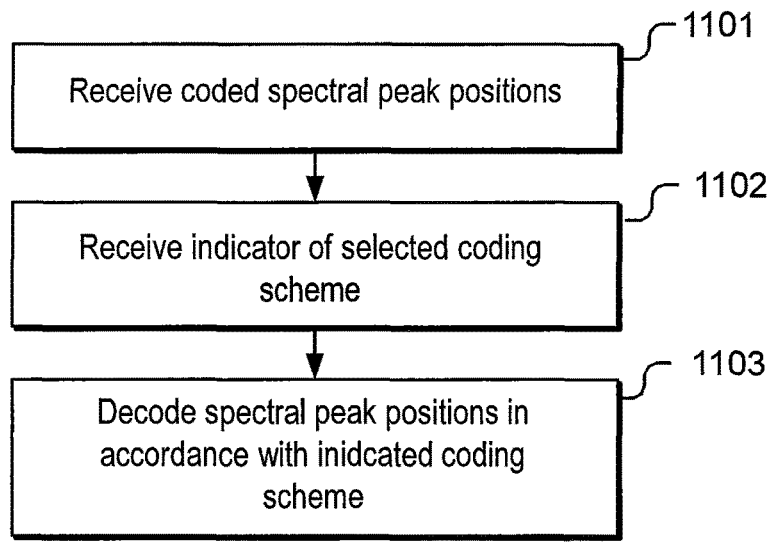
FIG. 11 is a flow chart illustrating an embodiment of the decoding method of the proposed technology.

FIG. 11 is a flow chart illustrating an embodiment of the decoding method of the proposed technology. In action 1101 coded spectral peak positions of an audio signal segment are received. In action 1102 an indicator of a coding scheme that was selected to code the spectral peak positions is received. In action 1103, the spectral peak positions are decoded in a decoding mode that corresponds to the indicated coding scheme. This may also be expressed as that the spectral peak positions are decoded in accordance with the indicated coding scheme, i.e. by use of a decoding scheme corresponding to the indicated coding scheme. The indicated coding scheme is one out of two lossless spectral peak coding schemes, where, as before, a first one of the two lossless spectral peak position coding schemes is suitable for periodic or semi-periodic spectral peak position distributions; and a second one of the two lossless spectral peak position coding schemes is suitable for sparse spectral peak position distributions.

When a coding scheme suitable for sparse spectral peak position distributions is indicated, the coded spectral peak positions may be received in form of a group bit vector and compressed non-zero bit groups indicated by the group bit vector. This corresponds to the sparse coding scheme as described earlier. The respective positions in the group bit vector may then represent consecutive equal size groups of bits. Further, an equal size group which comprises a spectral peak should be separable from an equal size group which does not comprise a spectral peak. An equal size group which comprises a spectral peak could also be denoted a non-zero bit group, and is indicated differently in the group bit vector than an equal size group not comprising a spectral peak. For example, a non-zero bit group could be indicated by "1" and a group not comprising a spectral peak could be indicated by "0" in the group bit vector, as in expressions (5)-(7) above.

The non-zero bit groups, if any indicated in the group bit vector, could then be decompressed based on constraints in the minimum allowed distance between two consecutive peaks. That is, the non-zero bit groups, which may be concatenated to the group bit vector in compressed form, may be decompressed by being demapped by use e.g. of a table, such as table 1 described above. Due to the constraints or restrictions regarding the minimum allowed distance between peaks, not all sequences are possible for the non-zero bit groups, and thus each possible sequence may be mapped to a shorter sequence, i.e. be compressed, as previously described.

The "zero-bit" groups, i.e. the groups not comprising any spectral peaks, if any indicated in the group bit vector, could be decompressed by generating a sequence of zeroes. Such a sequence of zeroes should be of the same size as a decompressed non-zero bit group, since the groups should be of equal size. There will typically be zero-bit groups indicated in the group bit vector, given that the sparse coding scheme or mode is applied for sparse spectral peak distributions.

When the indicated spectral peak position coding scheme is a coding scheme suitable for periodic or semi-periodic spectral peak position distributions, the decoding of the received spectral peak positions may comprise Huffman decoding and delta decoding, corresponding to the previously described encoding. The size of the Huffman table used for the Huffman decoding may be optimized together with the second spectral peak position coding scheme as previously described.

In alternative embodiments, where the encoder does not indicate the selected coding scheme to the decoder, the decoding method of the proposed technology could comprise so-called trial decoding of the spectral peak positions in two spectral peak position decoding modes suitable for different spectral peak position distributions. The decoding scheme or mode resulting in a successfully decoded set of spectral peak positions is assumed to correspond to the selected coding scheme.

Embodiments described herein also relate to a decoder operable to decode audio signals. The decoder is configured to perform at least one embodiment of the audio signal segment decoding method for decoding of spectral peak positions described above. The decoder is associated with the same technical features, objects and advantages as the corresponding coder and methods for coding and decoding of spectral peak positions described above. The decoder will be described in brief in order to avoid unnecessary repetition.

Figure 12:
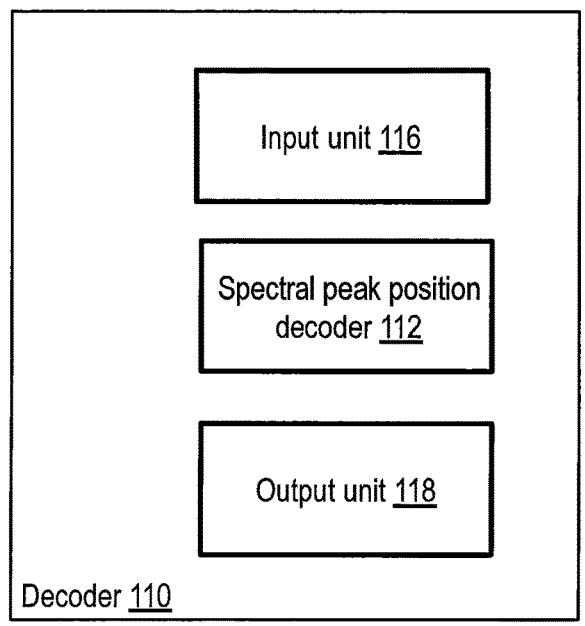
FIGS. 12-15 are block diagrams illustrating exemplifying embodiments of the proposed decoder.

FIG. 12 is a block diagram illustrating an embodiment of a proposed audio signal segment decoder 110. An input unit 116 receives coded spectral peak positions and a coding scheme indicator. The decoder 110 includes a spectral peak position decoder 112 configured to decode the spectral peak positions in a decoding mode that corresponds to the indicated one out of two spectral peak position coding modes suitable for different spectral peak position distributions. An output unit 118 outputs the decoded spectral peak positions. To decode in a certain "decoding mode" could alternatively be expressed as to use a decoding scheme which corresponds to a certain indicated coding scheme in order to decode the received coded spectral peak positions.

Figure 13:
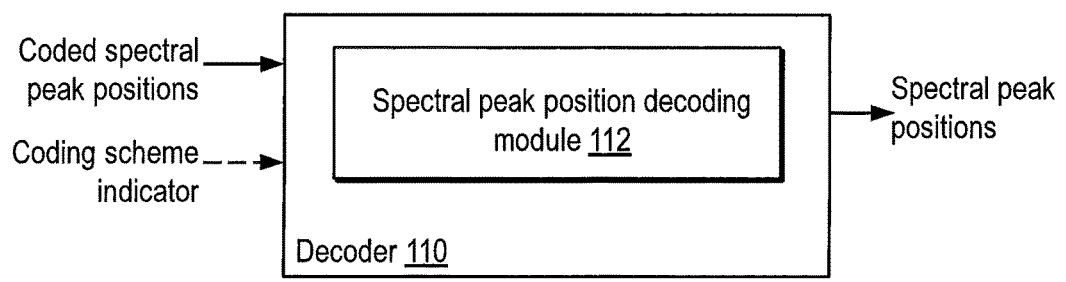

In one embodiment the spectral peak position decoder 112 is configured to receive coded spectral peak positions of an audio signal segment; to receive an indicator of a coding scheme that was selected to code the spectral peak positions; and to decode the spectral peak positions in a decoding mode that corresponds to the indicated coding scheme. The latter could alternatively be expressed e.g. as decoding the spectral peak positions based on the indicated coding scheme, or as decoding the spectral peak positions in accordance with the indicated coding scheme. FIG. 13 is a block diagram illustrating another embodiment of the proposed audio signal segment decoder 110. Coded spectral peak positions and a coding scheme indicator are forwarded to a spectral peak position decoding module 112, which outputs the decoded spectral peak positions.

In one embodiment the decoder 110 of FIG. 13 includes a spectral peak position decoding module 112 for decoding received coded spectral peak positions of an audio signal segment into spectral peak positions in a decoding mode that corresponds to a received indicator of a coding scheme that was selected to code the spectral peak positions.

In another embodiment the decoder 110 of FIG. 13 includes a spectral peak position decoding module 112 for trial decoding received coded spectral peak positions of an audio signal segment into spectral peak positions in at least two spectral peak position decoding modes suitable for different spectral peak position distributions, and outputting a set of successfully decoded spectral peak positions.

Figure 14:
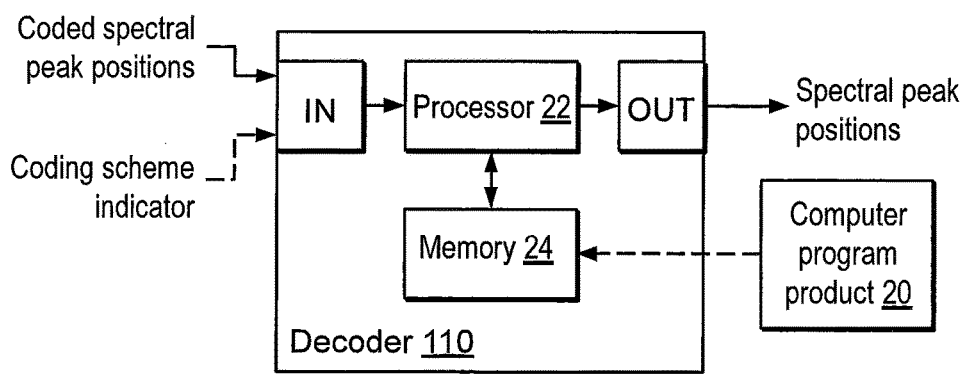

FIG. 14 is a block diagram illustrating an embodiment of the proposed decoder. This embodiment includes a processor 22 and a memory 24, where the memory contains instructions executable by the processor. The execution of the instructions makes the decoder 110 operative to decode the spectral peak positions in a decoding mode that corresponds to one of at least two spectral peak position coding modes suitable for different spectral peak position distributions. The instructions may be stored as a computer program product 120 on a computer readable medium and be transferred to the memory 24, as indicated by the dashed arrow on the right side of the figure. The coded spectral peak positions and the coding scheme are forwarded to the processor 22 over an input unit IN, and the decoded spectral peak positions are outputted over an output unit OUT.

In one embodiment the execution of the instructions by the processor renders the decoder of FIG. 14 operative to receive coded spectral peak positions of an audio signal segment; to receive an indicator of a coding scheme that was selected to code the spectral peak positions; and to decode the spectral peak positions in a decoding mode that corresponds to the indicated coding scheme.

FIG. 14 is a block diagram illustrating another embodiment of the proposed decoder 110. This embodiment is based on a processor 22, for example a microprocessor, which executes a computer program 130 for decoding spectral peak positions of an audio signal segment. The computer program is stored in memory 24. The processor 22 communicates with the memory over a system bus. The incoming coded spectral peak positions and a coding scheme indicator are received by an input/output (I/O) controller 26 controlling an I/O bus, to which the processor 22 and the memory 24 are connected. The (decoded) spectral peak positions obtained from the software 130 are outputted from the memory 24 by the I/O controller 26 over the I/O bus. The computer program 130 includes a code unit 132 for receiving coded spectral peak positions of an audio signal segment, a code unit 134 for receiving an indicator of a coding scheme that was selected to code the spectral peak positions, and a code unit 136 for decoding the spectral peak positions in a decoding mode that corresponds to the indicated coding scheme. The latter could also be expressed as: for decoding the spectral peak positions in correspondence with the indicated coding scheme.

Figure 15:
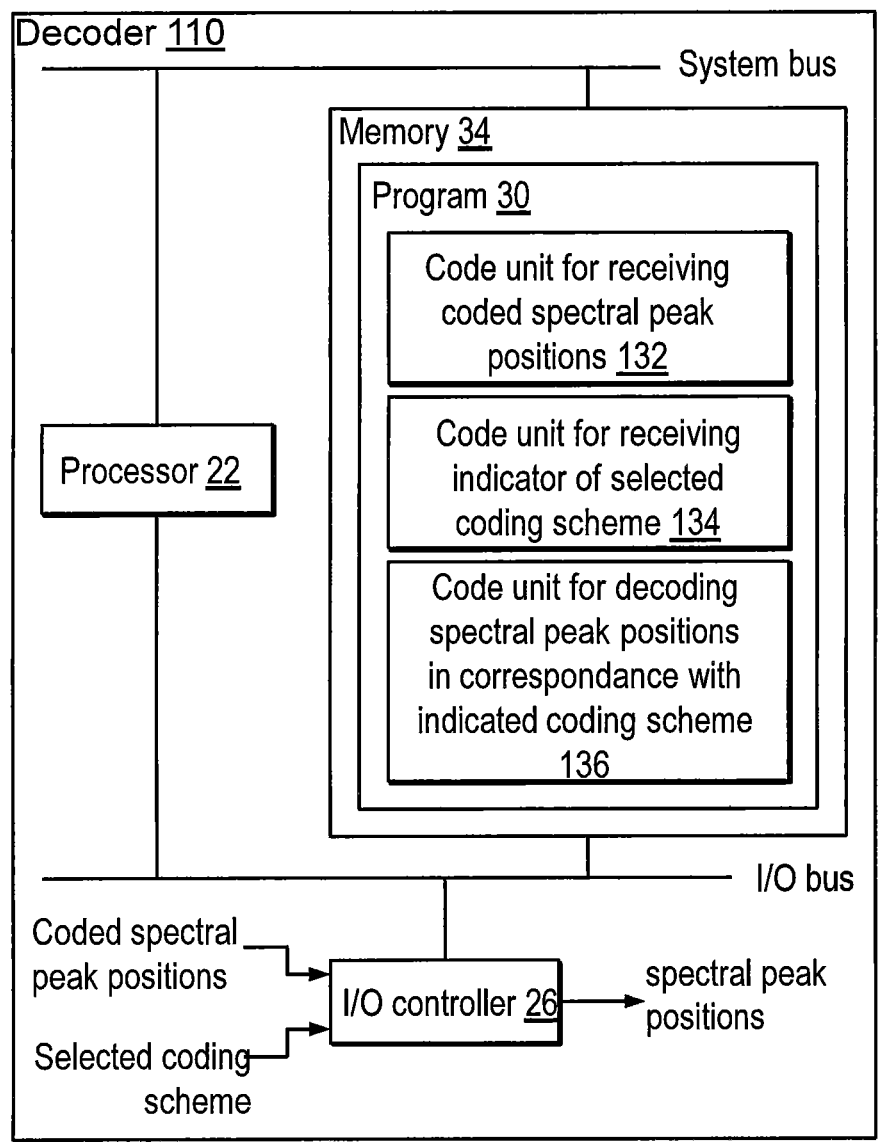

The computer program residing in memory may be organized as appropriate function modules configured to perform, when executed by the processor, at least part of the steps and/or tasks described above. An example of such function modules is illustrated in FIG. 15.

Figure 16:
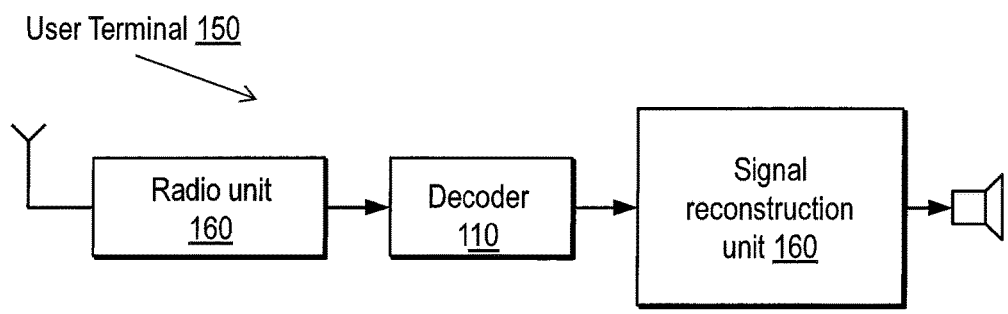
FIG. 16 is a block diagram illustrating an embodiment of a proposed user terminal.

FIG. 16 is a block diagram illustrating an embodiment of a proposed user terminal. The example illustrates a UE. A radio signal from an antenna is forwarded to a radio unit 160, and the digital signal from the radio unit is processed by a decoder 110 in accordance with the proposed technology. In particular the decoder 110 decodes the coded spectral peak positions of audio signal segments as described above (typically the coder may perform other task, such as decoding of other parameters describing the segment, but these tasks are not described since they are well known in the art and do not form an essential part of the proposed technology). The decoded spectral peak positions (and other parameters) are forwarded to a signal reconstruction unit 142 connected to a loudspeaker. The selected coding scheme may also be received at the decoder, as noted above.

The embodiments described above are merely given as examples, and it should be understood that the proposed technology is not limited thereto. It will be understood by those skilled in the art that various modifications, combinations and changes may be made to the embodiments without departing from the present scope. In particular, different part solutions in the different embodiments can be combined in other configurations, where technically possible.

ABBREVIATIONS

ASIC Application Specific Integrated Circuit
CPU Central Processing Units
DSP Digital Signal Processor
FPGA Field Programmable Gate Array
PLC Programmable Logic Controller

REFERENCES

[1] D. Salomon, G. Motta, "Handbook of Data Compression", Fifth Edition, 2010, p. 1111.

The invention claimed is:

1. An audio signal segment coding method for coding of spectral peak positions, the method comprising:
  performing, using a coder circuit, operations comprising:
    determining which one out of two lossless spectral peak position coding schemes that requires the least number of bits to code the spectral peak positions of an audio signal segment, wherein a first one of the two lossless spectral peak position coding schemes is more efficient than a second one of the two lossless spectral peak position coding schemes for periodic or semi-periodic spectral peak position distributions; and wherein the second one of the two lossless spectral peak position coding schemes is more efficient than the first one of the two lossless spectral peak position coding schemes for sparse spectral peak position distributions, and wherein the determining is based on a maximum distance $d_{max}$ between two spectral peaks in the audio signal segment and on comparing a number of bits required for the respective scheme after coding of the audio signal segment using the two schemes by the coder circuit;
    selecting the second one of the two lossless spectral peak position coding schemes when the maximum distance $d_{max}$ between two spectral peaks in the audio signal segment exceeds a threshold T and coding, by the coder circuit, the spectral peak positions of the audio signal segment using the second one of the two lossless spectral peak position schemes and storing the coded spectral peak positions of the audio signal segment in a memory circuit;
    responsive to the maximum distance dmax not exceeding the threshold T:
      coding, by the coder circuit, the spectral peak positions of the audio signal segment using the two lossless spectral peak position coding schemes;
      selecting the spectral peak position coding scheme that requires the least number of bits to code the spectral peak positions of the audio signal segment based on the coding by the coder circuit; and storing the coded spectral peak positions of the audio signal segment that was coded using the selected spectral peak position coding scheme in the memory circuit;

communicating the coded spectral peak positions of the audio signal segment from the memory circuit and an indication of the selected spectral peak position coding scheme to a radio transmitter circuit to transmit the coded spectral peak positions of the audio signal segment toward a decoder to enable the decoder to decode the coded spectral peak positions of the audio signal segment based on the indication of the selected spectral peak position coding scheme.

2. The method according to claim 1, wherein the selecting the spectral peak position coding scheme when the maximum distance $d_{max}$ does not exceed the threshold T is based on comparing a first number of bits used to code the spectral peak positions of the audio signal segment using the first one of the two lossless spectral peak position coding schemes with a second number of bits used to code the spectral peak position of the audio signal segment using the second one of the two lossless spectral peak position coding schemes.

3. The method of claim 1, wherein the first lossless spectral peak position coding scheme comprises:
delta coding of peak positions;
Huffman coding of delta codes.

4. The method of claim 3, wherein the size of the Huffman table is optimized together with the second spectral peak position coding scheme.

5. The method of claim 1, wherein the second lossless spectral peak position coding scheme comprises:
dividing a bit vector representing the spectral peak positions into consecutive equal size bit groups;
OR-ing the bits in each group to form a group bit vector;
compressing non-zero bit groups by exploiting constraints in the minimum allowed distance between two consecutive peaks; and
forming a compressed bit vector by concatenating the group bit vector and the compressed non-zero bit groups.

6. An audio signal segment apparatus for coding of spectral peak positions, comprising:
a coder circuit comprising a processor and a memory coupled to the processor, the memory comprising instructions that when executed by the processor causes the processor to perform operations comprising:
determining which one out of two lossless spectral peak position coding schemes that requires the least number of bits to code the spectral peak positions of an audio signal segment, wherein a first one of the two lossless spectral peak position coding schemes is more efficient than a second one of the two lossless spectral peak position coding schemes for periodic or semi-periodic spectral peak position distributions; and wherein the second one of the two lossless spectral peak position coding schemes is more efficient than the first one of the two lossless spectral peak position coding schemes for sparse spectral peak position distributions, and wherein the determining is based on a maximum distance $d_{max}$ between two spectral peaks in the audio signal segment and on comparing a number of bits required for the respective scheme after coding of the audio signal segment using the two schemes by the coder circuit;
selecting the second one of the two lossless spectral peak position coding schemes when the maximum distance $d_{max}$ between two spectral peaks in the audio signal segment exceeds a threshold T and coding, by the coder circuit, the spectral peak positions of the audio signal segment using the second one of the two lossless spectral peak position schemes and storing the coded spectral peak positions of the audio signal segment in a memory circuit;
responsive to the maximum distance dmax not exceeding the threshold T:
coding, by the coder circuit, the spectral peak positions of the audio signal segment using the two lossless spectral peak position coding schemes;
selecting the spectral peak position coding scheme that requires the least number of bits to code the spectral peak positions of the audio signal segment based on the coding by the coder circuit; and
storing the coded spectral peak positions of the audio signal segment that was coded using the selected spectral peak position coding scheme in the memory circuit;
communicating the coded spectral peak positions of the audio signal segment from the memory circuit and an indication of the selected spectral peak position coding scheme to a radio transmitter circuit to transmit the coded spectral peak positions of the audio signal segment toward a decoder to enable the decoder to decode the coded spectral peak positions of the audio signal segment based on the indication of the selected spectral peak position coding scheme.

7. The audio signal segment apparatus according to claim 6, wherein the selecting the spectral peak position coding scheme when the maximum distance $d_{max}$ does not exceed the threshold T is based on comparing a first number of bits used to code the spectral peak positions of the audio signal segment using the first one of the two lossless spectral peak position coding schemes with a second number of bits used to code the spectral peak position of the audio signal segment using the second one of the two lossless spectral peak position coding schemes.

8. The audio signal segment apparatus according to claim 6, wherein the first lossless spectral peak position coding scheme comprises:
delta coding of peak positions; and
Huffman coding of delta codes.

9. The audio signal segment apparatus according to claim 8, wherein the size of the Huffman table is optimized together with the second spectral peak position coding scheme.

10. The audio signal segment apparatus according to claim 7, wherein the second lossless spectral peak position coding scheme comprises:
dividing a bit vector representing the spectral peak positions into consecutive equal size groups;
OR-ing the bits in each group to form a group bit vector;
compressing non-zero bit groups by exploiting constraints in the minimum allowed distance between two consecutive peaks; and
forming a compressed bit vector by concatenating the group bit vector and the compressed non-zero bit groups.

11. A user terminal including an audio signal segment apparatus in accordance with claim 6.

12. The method according to claim 1, wherein the coded spectral peak positions are received in form of a group bit vector and compressed non-zero bit groups indicated by the group bit vector when the indicated spectral peak position coding scheme is the second one of the two lossless spectral peak position coding schemes.

13. The method according to claim 12, wherein respective positions in the group bit vector represents consecutive equal size groups, and where an equal size group comprising a spectral peak is indicated differently in the group bit vector than an equal size group not comprising a spectral peak.

14. The method according to claim 12, further comprising:
 decompressing any non-zero bit groups based on constraints in the minimum allowed distance between two consecutive peaks, and
 decompressing any group not comprising a spectral peak by generating a sequence of zeroes.

15. The audio signal segment apparatus according to claim 6, wherein the coded spectral peaks are received in form of a group bit vector and compressed non-zero bit groups indicated by the group bit vector, when the indicated spectral peak position coding scheme is the second one of the two lossless spectral peak position coding schemes.

16. The audio signal segment apparatus according to claim 15 wherein respective positions in the group bit vector represents consecutive equal size groups, and where an equal size group comprising a spectral peak is indicated differently in the group vector than an equal size group not comprising a spectral peak.

17. The audio signal segment apparatus according to claim 15, wherein the operations further comprise:
 decompressing any non-zero bit groups based on constraints in the minimum allowed distance between two consecutive peaks, and
 decompressing any group not comprising a spectral peak by generating a sequence of zeroes.

18. The audio signal segment apparatus according to claim 15, wherein the decoding of the spectral peak positions comprises Huffman decoding and delta decoding when the indicated spectral peak position coding scheme is the first one of the two lossless spectral peak position coding schemes.

19. The audio signal segment apparatus according to claim 18, wherein the size of the Huffman table is optimized together with the second spectral peak position coding scheme.

* * * * *

UNITED STATES PATENT AND TRADEMARK OFFICE
CERTIFICATE OF CORRECTION

| | | |
|---|---|---|
| PATENT NO. | : 9,997,165 B2 | |
| APPLICATION NO. | : 14/402406 | |
| DATED | : June 12, 2018 | |
| INVENTOR(S) | : Grancharov et al. | |

It is certified that error appears in the above-identified patent and that said Letters Patent is hereby corrected as shown below:

In the Drawings

In Fig. 9, Sheet 6 of 10, delete "Memory 34" and insert -- Memory 24 --, therefor.

In Fig. 16, Sheet 9 of 10, delete "160" and insert -- 142 --, therefor.

In Fig. 15, Sheet 10 of 10, delete "Memory 34" and insert -- Memory 24 --, therefor.

In Fig. 15, Sheet 10 of 10, delete "Program 30" and insert -- Program 130 --, therefor.

In the Specification

In Column 4, Line 37, delete "zero's" and insert -- zeroes --, therefor.

In Column 4, Line 40, delete "$P_2=18$),)." and insert -- $P_2=18$). --, therefor.

In Column 4, Line 63, delete "zero's." and insert -- zeroes. --, therefor.

In Column 7, Line 25, delete ""1 s"" and insert -- "1s" --, therefor.

In Column 8, Line 18, delete "coder 500," and insert -- coder 10, --, therefor.

In Column 8, Lines 22-23, delete "coder 500" and insert -- coder 10 --, therefor.

In Column 13, Line 28, delete "FIG. 14" and insert -- FIG. 15 --, therefor.

In the Claims

In Column 15, Line 34, in Claim 5, delete "each group" and insert -- each bit group --, therefor.

Signed and Sealed this
Eighteenth Day of September, 2018

Andrei Iancu
*Director of the United States Patent and Trademark Office*

In Column 16, Line 51, in Claim 10, delete "claim 7," and insert -- claim 6, --, therefor.

In Column 18, Line 3, in Claim 16, delete "group vector" and insert -- group bit vector --, therefor.